(12) United States Patent
Nakahara et al.

(10) Patent No.: US 11,171,068 B2
(45) Date of Patent: Nov. 9, 2021

(54) METHOD OF MANUFACTURING SEMICONDUCTOR DEVICE, SEMICONDUCTOR DEVICE, AND POWER CONVERSION DEVICE

(71) Applicant: Mitsubishi Electric Corporation, Tokyo (JP)

(72) Inventors: Kenta Nakahara, Tokyo (JP); Akitoshi Shirao, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/558,389

(22) Filed: Sep. 3, 2019

(65) Prior Publication Data
US 2020/0168519 A1  May 28, 2020

(30) Foreign Application Priority Data
Nov. 28, 2018  (JP) .............................. JP2018-222284

(51) Int. Cl.
*H01L 23/31* (2006.01)
*H01L 21/56* (2006.01)
(Continued)

(52) U.S. Cl.
CPC ........ *H01L 23/3121* (2013.01); *H01L 21/565* (2013.01); *H01L 23/293* (2013.01); *H01L 23/49838* (2013.01); *H01L 24/40* (2013.01); *H01L 24/84* (2013.01); *H02M 7/44* (2013.01); *B29C 67/04* (2013.01); *B29K 2063/00* (2013.01); *B29L 2031/3406* (2013.01); *H01L 24/32* (2013.01); *H01L 24/73* (2013.01); *H01L 2224/32225* (2013.01); *H01L 2224/40155* (2013.01); *H01L 2224/40505* (2013.01);
(Continued)

(58) Field of Classification Search
CPC combination set(s) only.
See application file for complete search history.

(56) References Cited

U.S. PATENT DOCUMENTS

| 2004/0217472 A1* | 11/2004 | Aisenbrey ............. H01L 23/552 257/734 |
| 2009/0065590 A1* | 3/2009 | Aoki ................ G06K 19/07749 235/492 |

(Continued)

FOREIGN PATENT DOCUMENTS

JP  2015-220238 A  12/2015

*Primary Examiner* — Jarrett J Stark
(74) *Attorney, Agent, or Firm* — Studebaker & Brackett PC

(57) ABSTRACT

A method of manufacturing a semiconductor device includes providing, in a housing, an insulating substrate having a metal pattern, a semiconductor chip, a sinter material applied on the semiconductor chip, and a terminal, providing multiple granular sealing resins supported by a grid provided in the housing, heating an inside of the housing until a temperature thereof reaches a first temperature higher than a room temperature and thereby discharging a vaporized solvent of the sinter material out of the housing via a gap of the grid and a gap of the sealing resins, and heating the inside of the housing until the temperature thereof reaches a second temperature higher than the first temperature and thereby causing the melted sealing resins to pass the gap of the grid and form a resin layer covering the semiconductor chip.

6 Claims, 7 Drawing Sheets

(51) Int. Cl.
*H01L 23/498* (2006.01)
*H01L 23/00* (2006.01)
*H01L 23/29* (2006.01)
*H02M 7/44* (2006.01)
*B29K 63/00* (2006.01)
*H02P 27/08* (2006.01)
*B29C 67/04* (2017.01)
*B29L 31/34* (2006.01)

(52) U.S. Cl.
CPC ............ *H01L 2224/73263* (2013.01); *H01L 2224/8484* (2013.01); *H01L 2924/01029* (2013.01); *H01L 2924/01047* (2013.01); *H02P 27/08* (2013.01)

(56) References Cited

U.S. PATENT DOCUMENTS

| | | | |
|---|---|---|---|
| 2012/0074599 A1* | 3/2012 | Kim | H01L 21/565 257/793 |
| 2013/0095282 A1* | 4/2013 | Taketa | B29C 70/20 428/113 |
| 2015/0348936 A1* | 12/2015 | Lin | H01L 21/568 257/659 |
| 2016/0247751 A1* | 8/2016 | Kinzer | H01L 24/97 |
| 2017/0365566 A1* | 12/2017 | Lee | H01L 23/5384 |
| 2018/0102322 A1* | 4/2018 | Kang | H01L 23/3114 |
| 2018/0166363 A1* | 6/2018 | Heppner | H01L 25/0655 |
| 2018/0240757 A1* | 8/2018 | Wong | H01L 23/552 |
| 2019/0006288 A1* | 1/2019 | Wang | H01L 21/6836 |
| 2019/0061305 A1* | 2/2019 | Apfel | B32B 3/12 |
| 2019/0131285 A1* | 5/2019 | Kim | H01L 28/40 |
| 2020/0075501 A1* | 3/2020 | Raorane | H01L 24/49 |
| 2020/0286839 A1* | 9/2020 | Jang | H01L 23/552 |

\* cited by examiner

METHOD OF MANUFACTURING SEMICONDUCTOR DEVICE, SEMICONDUCTOR DEVICE, AND POWER CONVERSION DEVICE

BACKGROUND

Field

The present invention relates to a method of manufacturing a semiconductor device, a semiconductor device, and a power conversion device.

Background Art

JP 2015-220238A discloses a semiconductor power module including a heat resistant housing, an insulated wiring board on which a power semiconductor device is implemented, a radiator in contact with the insulated wiring board to release heat generated in the insulated wiring board, a heat resistant silicone gel filled inside the heat resistant housing, and an in-plane stress relaxation component arranged in the vicinity of a sidewall in the heat resistant housing. The in-plane stress relaxation component is embedded in the heat resistant silicone gel so as to prevent the heat resistant silicone gel from being detached from the sidewall when the heat resistant silicone gel cures.

As an example, in a case where a semiconductor device of a power module or the like is to be manufactured, a semi-finished product needs to be moved frequently in each step of the manufacturing process to feed the semi-finished product into a semiconductor manufacturing apparatus and take the semi-finished product out of the semiconductor manufacturing apparatus. For example, the semi-finished product may be heated by a heating apparatus so as to connect a semiconductor chip to a terminal or a metal pattern by solder and subsequently the semi-finished product is taken out of the heating apparatus and cooled, a material for a sealing resin may be provided, and the semi-finished product may be heated again by the heating apparatus to melt the sealing resin. As a result, for example, when it is necessary to add a component such as a sealing resin to the semi-finished product that is being manufactured, the semi-finished product whose temperature has been raised has to be cooled and then heated again to raise its temperature, which makes it difficult to shorten the time needed to manufacture the semiconductor device.

SUMMARY

The present invention addresses the above-identified problem, and an object of the present invention is to provide a method of manufacturing a semiconductor device, a semiconductor device, and a power conversion device which make it possible to shorten the time needed to manufacture a semiconductor device.

In some examples, a method of manufacturing a semiconductor device includes providing, in a housing, an insulating substrate having a metal pattern, a semiconductor chip, a sinter material applied on the semiconductor chip, and a terminal, providing multiple granular sealing resins supported by a grid provided in the housing, heating an inside of the housing until a temperature thereof reaches a first temperature higher than a room temperature and thereby discharging a vaporized solvent of the sinter material out of the housing via a gap of the grid and a gap of the sealing resins, and heating the inside of the housing until the temperature thereof reaches a second temperature higher than the first temperature and thereby causing the melted sealing resins to pass the gap of the grid and form a resin layer covering the semiconductor chip.

Other and further objects, features and advantages of the invention will appear more fully from the following description.

DETAILED DESCRIPTION

Figure 1:
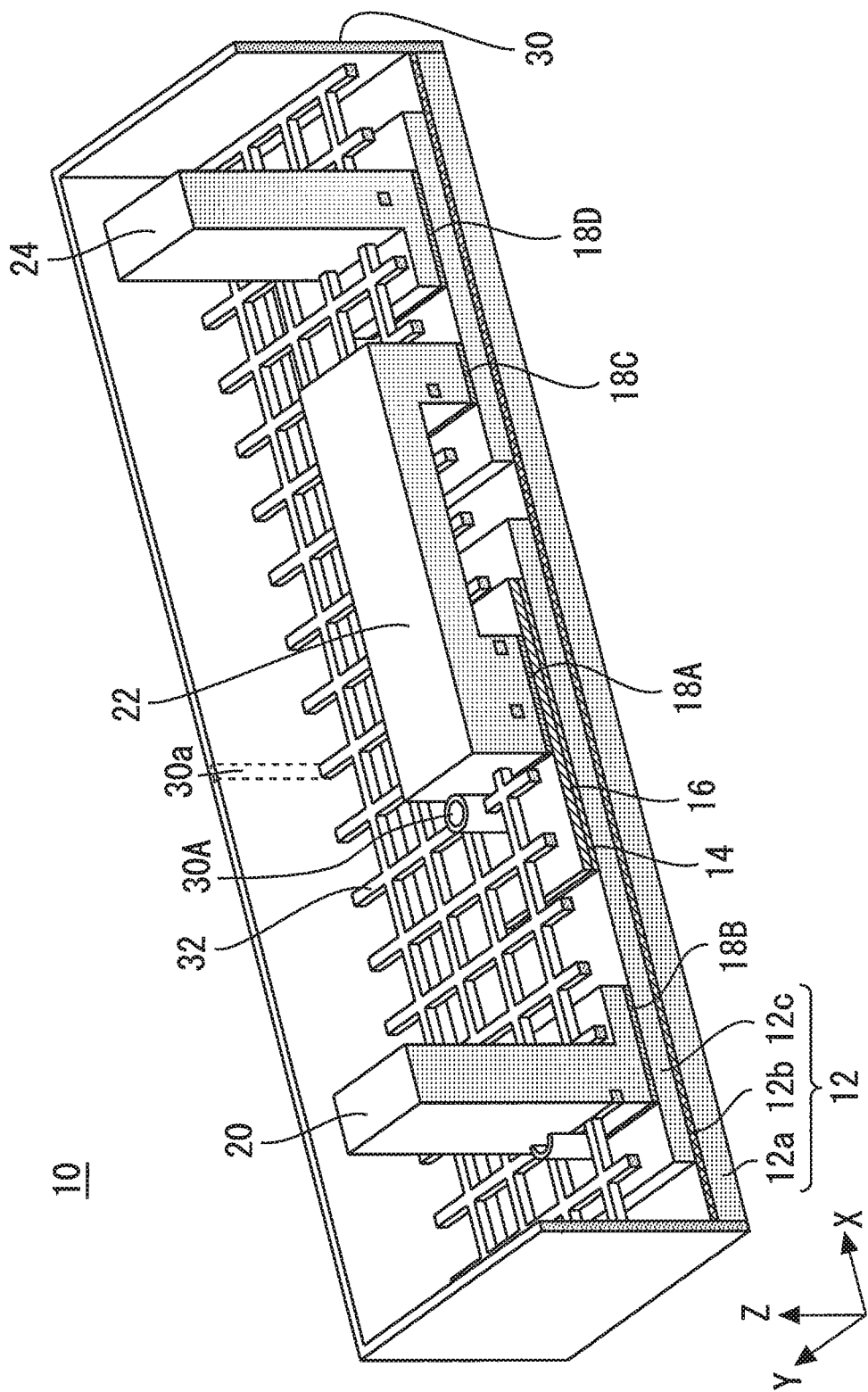
FIG. 1 is a cross-sectional perspective view of a semi-finished semiconductor device according to first embodiment.

A method of manufacturing a semiconductor device, the semiconductor device, and a power conversion device according to embodiments of the present invention will be described hereinbelow with reference to the drawings. The same or corresponding components are designated by the same reference numerals and detailed explanations thereof may not be repeated to avoid redundancy.

First Embodiment

Figure 2:
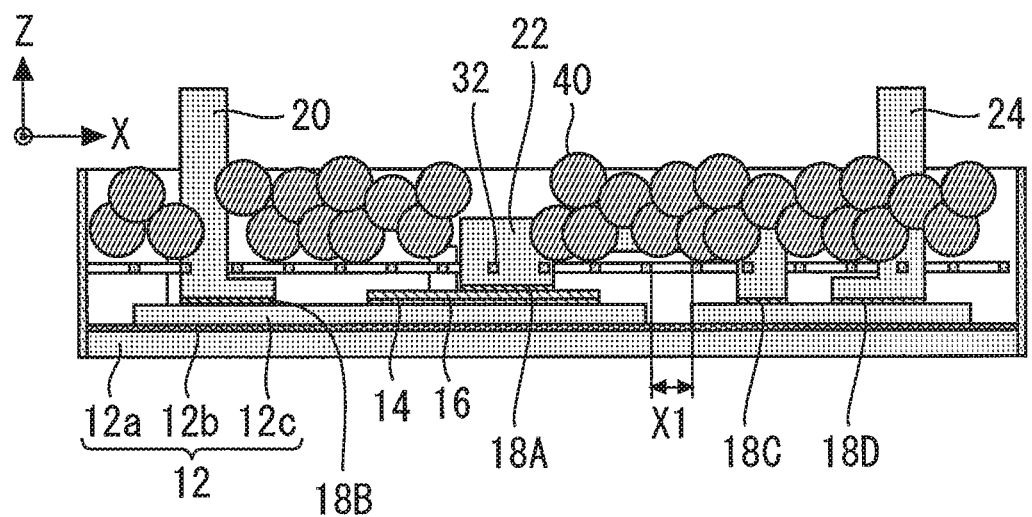
FIG. 2 is a cross-sectional view of the semiconductor device where the granular sealing resins are depicted.
Figure 3:
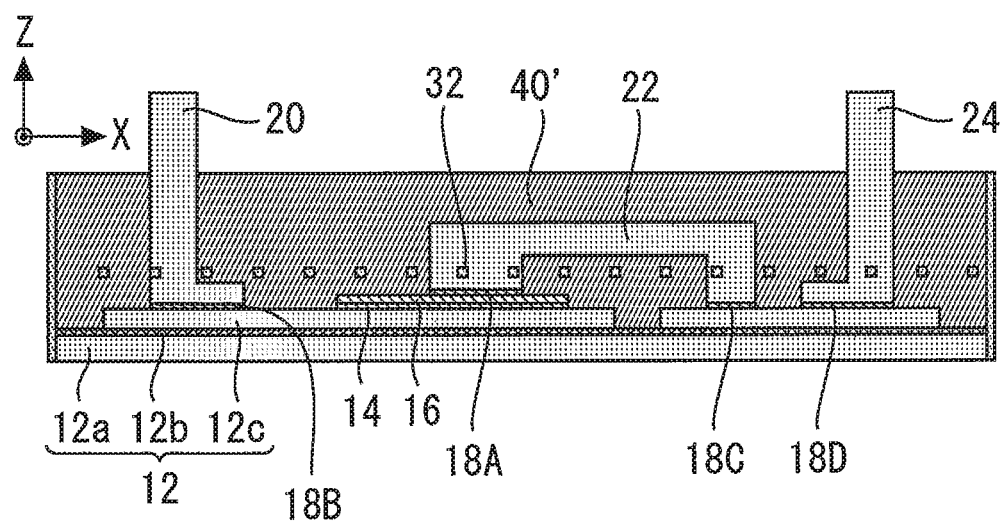
FIG. 3 is a cross-sectional view of the resin-sealed semiconductor device.

A method of manufacturing a semiconductor device according to the first embodiment will be described with reference to FIGS. 1 to 3. FIG. 1 is a cross-sectional perspective view of a semiconductor device which is being manufactured in a manufacturing process thereof. First, a semiconductor chip 16 is fixed to a metal pattern 12c of an insulating substrate 12. For example, a sinter material such as Ag or Cu or a bonding material 14 made of solder is provided on the metal pattern 12c and the semiconductor chip 16 is fixed to the metal pattern 12c using the bonding material 14. The insulating substrate 12 may include a metal base plate 12a, an insulating layer 12b formed on the metal base plate 12a, and a metal pattern 12c formed on the insulating layer 12b.

Subsequently, the insulating substrate 12 is fixed to a housing 30. The housing 30 may be an enclosure with four sides. The insulating substrate 12 is fixed to the inner wall or the lower end of the housing 30. The specific methods for fixing the insulating substrate 12 to the housing 30 may include use of an adhesive, mechanical fitting, etc. A grid 32 may be fixed in advance to the housing 30. The grid 32 may be provided above the semiconductor chip 16 in the housing 30 such that the grid 32 faces the insulating substrate 12. As an example, the grid 32 and the semiconductor chip 16 may be parallel to each other. The grid 32 may be provided as a part of the housing 30. In that case, the housing 30 and the grid 32 are in one piece with each other and made of the same material. For example, if the housing 30 is made of resin, then the grid 32 is also made of resin. The grid 32 may be provided as a separate component that is separate from the housing 30. In that case, all or part of the ends of the grid 32 may be fixed to the inner wall of the housing 30, for example, by an adhesive. It is also possible to form a groove that extends in a z-direction on the inner wall of the housing 30 to bring the grid 32 into fitting engagement with the groove. FIG. 1 depicts such a groove 30a indicated in a virtual manner by dashed lines. The groove 30a may be formed on at least one of the inner walls of the housing 30.

A sinter material 18A such as Ag or Cu is applied onto the wiring locations on the semiconductor chip 16 before or after the insulating substrate 12 is fixed to the housing 30. At the same time, sinter materials 18B, 18C, 18D are applied onto the metal pattern 12c. These sinter materials are provided as a sinter bonding paste made of Ag or Cu. A sinter material made of any material other than Ag and Cu may also be used. According to an example, at least one of the sinter materials 18A, 18B, 18C, 18D may be provided by providing the sinter material in a cylindrical section 30A provided as a part of the housing 30 in contact with the grid 32. Circuit wiring may be formed by bringing terminals 20, 22, 24 made of metal such as Cu into contact with the sinter materials 18A, 18B, 18C, 18D.

By the above-described process, the insulating substrate 12 having the metal pattern 12c, the semiconductor chip 16, the sinter material 18A applied on the semiconductor chip 16, and the terminals 20, 22, 24 are provided inside the housing 30. The individual steps of the above-described process may be basically associated with the purpose of forming the circuit wiring.

Subsequently, multiple granular sealing resins are fed into the housing 30. FIG. 2 is a cross-sectional view of the semiconductor device, where the granular sealing resins 40 are depicted. The shape of the sealing resins 40 is not limited to a particular one. Meanwhile, the sealing resins 40 have a size such that it is larger than the opening of the grid 32 so as not to fall from the grid 32. As a result, when the sealing resins 40 are fed into the housing 30 in the positive direction in the z-direction, the sealing resins 40 will be supported by the grid 32 provided inside the housing 30.

Subsequently, a semi-finished product of the above-described semiconductor device is fed into a high-temperature processing device such as an oven or reflow furnace and subjected to thermal treatment at high temperature, and thus the sintering process for the sinter materials 18A, 18B, 18C, 18D and the curing process for the sealing resins 40 are performed. For example, the temperature of the semiconductor device is raised in a stepless or stepwise manner and the solvents used in the sinter materials 18A, 18B, 18C, 18D are vaporized. At this point, the vaporized solvents of the sinter materials are discharged to the outside of the housing 30 via the gaps of the grid 32 and the gaps of the sealing resins 40. In the context of the example illustrated in FIG. 2, the vaporized solvents move upward in the positive direction in the z-direction to be discharged to the outside of the housing 30. The vaporization of the solvents and the discharge of the vaporized solvents are realized by heating the inside of the housing 30 until its temperature reaches a first temperature above room temperature. As a result of the sintering process, the terminal 20 is fixed to the metal pattern 12c; the terminal 22 is fixed to the semiconductor chip 16 and the metal pattern 12c; and the terminal 24 is fixed to the metal pattern 12c. As a result, the solvents will disappear. There is no significant melting of the sealing resins 40 in a state where the inside of the housing 30 is at the first temperature. According to an example, the temperature at which the solvents used in the sinter materials 18A, 18B, 18C, 18D evaporate is 100° C. and the first temperature may be defined in the range from 100° C. to 150° C.

Subsequently, the inside of the housing 30 is heated until its temperature reaches a second temperature higher than the first temperature to melt the sealing resins 40. The second temperature may be defined, for example, within the range from 170° C. to 250° C. FIG. 3 is a cross-sectional view of the resin-sealed semiconductor device. The melted sealing resins 40 pass through the gaps of the grid 32 and form a resin layer 40' that covers the semiconductor chip 16. In other words, the melted sealing resins 40 flow out of the grid 32 of the housing 30 downward and begin to cure after having spread on the entire insulating substrate 12, and thus formation of the sealing resin by the resin layer 40' and curing thereof will be completed.

As described above, the sintering process and formation and curing of the sealing resin are completed by the series of steps of the temperature rising process. Since the gas that has been generated by vaporization of the solvents used in the sinter materials 18A, 18B, 18C, 18D is discharged to the outside through the gaps of the grid 32 and the gaps of the multiple granular sealing resins 40, creation of voids in the resin layer 40' can be suppressed. In order to achieve this effect, the material for the sealing resins 40 should be selected such that the sealing resins 40 do not exhibit a significant deformation at the temperature at which the solvents used in the sinter materials 18A, 18B, 18C, 18D evaporate. According to an example, after the solvents have evaporated, the sealing resins 40 melt and begin to flow, by which the resin-sealing process begins, and the assembly will be completed by finally sealing the entire inside of the housing 30 with the resin layer 40'.

For example, the sintering temperature of the sinter materials 18A, 18B, 18C, 18D may be as high as 200° C. or higher, in response to which the glass-transition temperature Tg of the sealing resins 40 can be raised. Also, depletion in resin layer 40' can be reduced by creating a vacuum atmosphere in a chamber accommodating the semiconductor device immediately before the sealing resins 40 begin to flow. In other words, it contributes to reduction of voids in the resin layer 40' to make the pressure of the atmosphere around the housing 30 lower than atmospheric pressure when the inside of the housing 30 is heated until its temperature reaches the second temperature. The series of steps of the above-described heating process may be performed at a pressure lower than the atmospheric pressure or in a state of vacuum.

The temperature rising sequence to raise the temperature via the first temperature to the second temperature may be defined taking into account the degree of the progress of the sintering and the degree of melting of the sealing resin. For example, it contributes to the simplification of the process to heat the inside of the housing 30 to the second temperature without cooling the inside of the housing 30 after the inside of the housing 30 has been heated until its temperature reaches the first temperature. The method of manufacturing a semiconductor device in accordance with the first embodiment makes it possible to provide a highly reliable semiconductor device by a simplified process.

Various modifications may be made to the semiconductor device according to the first embodiment as long as the semiconductor device has its intended features. For example, it is also possible to provide only either one of the sinter material 18A bonding the semiconductor chip 16 and the terminal 22 to each other and the sinter materials 18B, 18C, 18D bonding the metal pattern 12c and the terminals 20, 22, 24 to each other. That is, the locations at which the sinter materials are to be provided are not limited to a particular one. The sinter materials may be used to bond any appropriate components to each other inside the housing. The grid 32 may be fixed to the housing 30 by an adhesive or may be brought into fitting engagement with the housing 30.

Since the methods of manufacturing a semiconductor device and the semiconductor devices according to the following embodiments have much in common with those according to the first embodiment, description of the following embodiments will focus on the features different from those in the first embodiment.

Second Embodiment

Figure 4:
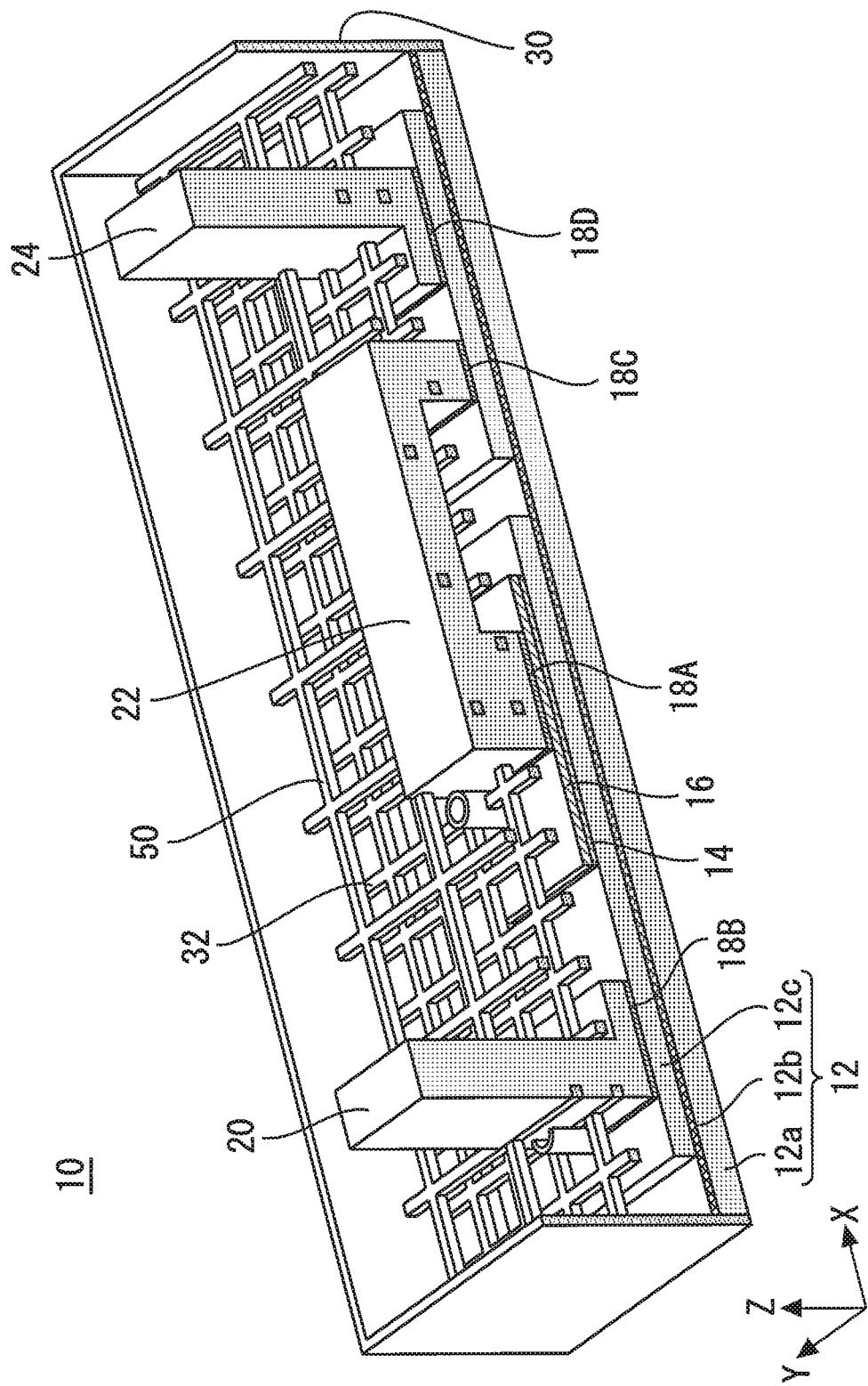
FIG. 4 is a cross-sectional perspective view of a semi-finished semiconductor device according to second embodiment.
Figure 5:
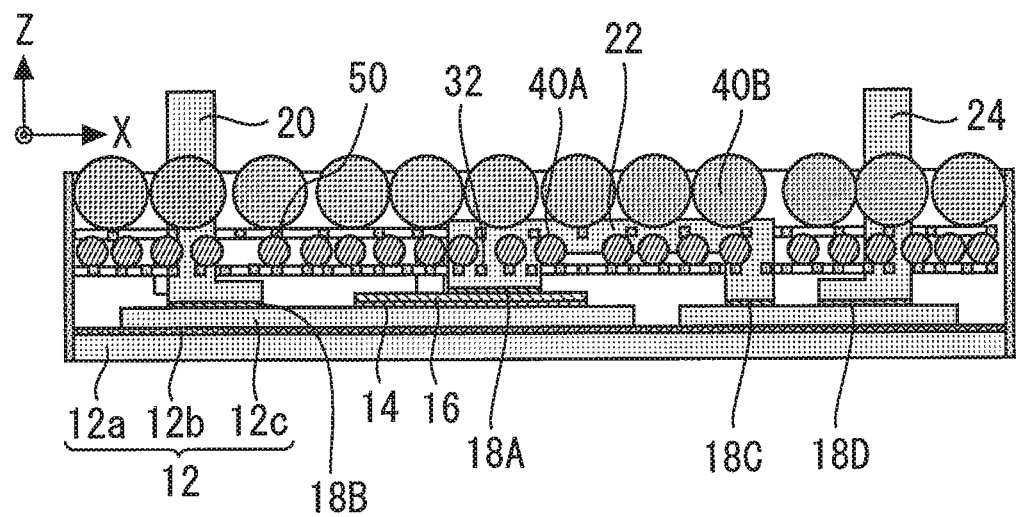
FIG. 5 is a cross-sectional view of the semiconductor device having two types of sealing resins.
Figure 6:
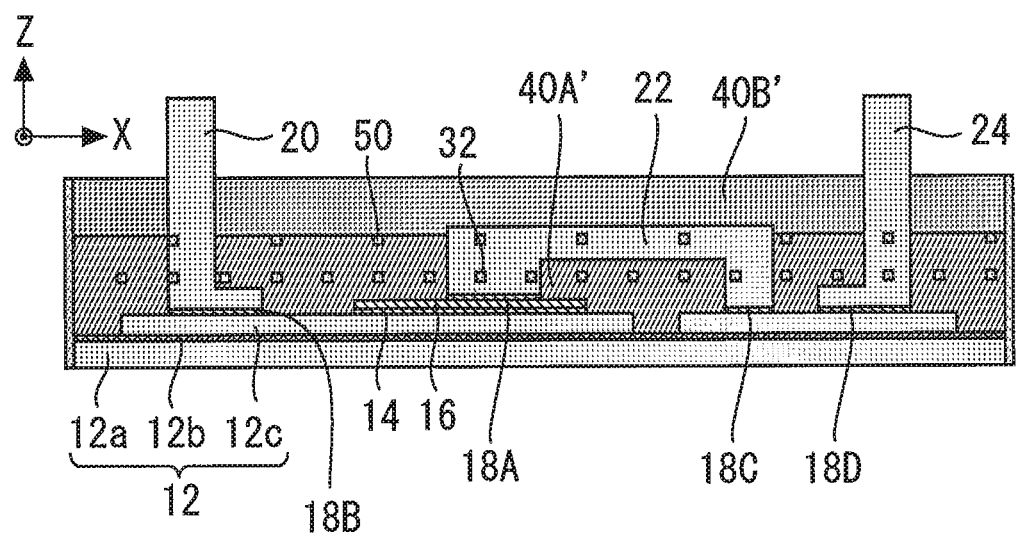
FIG. 6 is a cross-sectional view of the semiconductor device whose two types of sealing resins are melted.

FIGS. 4 to 6 are diagrams that illustrate the method of manufacturing a semiconductor device according to a second embodiment. The semiconductor device according to the second embodiment includes an upper grid 50. The upper grid 50 is provided on the grid 32 inside the housing 30. The upper grid 50 may be fixed to the inner wall of the housing 30 by an adhesive or fitting engagement therewith. According to an example, an opening provided by the upper grid 50 is larger than the opening provided by the grid 32. While the grid 32 can support a relatively small sealing resin, the upper grid 50 has the larger opening and cannot support a small sealing resin but can support a relatively large sealing resin.

FIG. 5 is a cross-sectional view of the semiconductor device diagram, which illustrates a state where two sealing resins of two types are provided inside the housing. According to the method of manufacturing a semiconductor device in accordance with the second embodiment, when the sealing resins 40A are fed into the housing 30 in the positive direction in the z-direction, then the sealing resins 40A pass through the upper grid 50 to be brought into contact with the grid 32 and supported by the grid 32. After that, multiple auxiliary sealing resins 40B are fed into the housing 30 in the positive direction in the z-direction. The auxiliary sealing resins 40B are larger than the sealing resins 40A and supported by the upper grid 50. According to an example, the auxiliary sealing resins 40B may be a granular object with a melting point higher than that of the sealing resins 40A. In this manner, the sealing resins 40A supported by the grid 32 and the auxiliary sealing resins 40B supported by the upper grid 50 are provided. According to an example, the melting point of the sealing resins 40A may be 150° C. while the melting point of the auxiliary sealing resins 40B may be 175° C. Also, the auxiliary sealing resins 40B may be made of a resin that is less likely to absorb moisture than the sealing resins 40A. In other words, the auxiliary sealing resins 40B have a lower water absorption rate than that of the sealing resins 40A. The physical properties of the resin such as melting point and water absorption rate may be tuned to any appropriate values, for example, by using epoxy resin to form the auxiliary sealing resins 40B and the sealing resins 40A and adjusting the components of the epoxy resin. Epoxy resin may also be used to form resins other than that of the second embodiment.

Heat treatment is subsequently performed. FIG. 5 is a cross-sectional view of the semiconductor device that is not yet to be subjected to the heat treatment. FIG. 6 is a cross-sectional view of the semiconductor device that has undergone the heat treatment. First, as described in the foregoing, the inside of the housing is heated until its temperature reaches the first temperature to carry out the sintering process. The first temperature is, for example, lower than 150° C. At this point, there will be no significant melting of the sealing resin 40A and the auxiliary sealing resin 40B. After that, the sealing resin 40A is melted by heating the inside of the housing 30 to the second temperature without cooling the inside of the housing 30. The second temperature is, for example, 150° C. or higher and lower than 175° C. The resin layer 40A' will thus be formed as illustrated in FIG. 6. According to another example, the second temperature may also be 170° C. or higher and lower than 180° C. and the melting point of the sealing resin 40A may be defined within this temperature range. The second temperature may be defined as any appropriate temperature at which the sealing resin 40A is melted.

The auxiliary sealing resins 40B are melted by heating the inside of the housing 30 to a third temperature higher than the second temperature after having heated the inside of the housing 30 to the second temperature. The third temperature may be 175° C. or higher and 250° C. or lower. According to another example, the third temperature may be defined as a temperature of 180° C. to 250° C. and the melting point of the auxiliary sealing resins 40B may be defined within this temperature range. The melted auxiliary sealing resins 40B pass through the gaps of the upper grid 50 and the gaps of the grid 32 and form an auxiliary resin layer 40B' on the resin layer 40A'. In this manner, it is made possible to implement resin sealing of the inside of the housing by using the resin layer 40A' and the auxiliary resin layer 40B' having different physical properties. Since the water absorption rate of the auxiliary sealing resins 40B is lower than that of the sealing resins 40A, the moisture resistance of the device can be improved by arranging the auxiliary resin layer 40B' having the lower water absorption rate on the surface of the device.

It contributes to reduction of voids in at least either of the resin layer 40A' and the auxiliary resin layer 40B' to make the pressure of the atmosphere around the housing 30 lower than the atmospheric pressure when the temperature of the inside of the housing 30 is heated until its temperature reaches the third temperature. Also, the process will be accelerated by heating the inside of the housing 30 to the third temperature without cooling the inside of the housing 30 after the inside of the housing 30 has been heated until its temperature reaches the second temperature.

Reliability of a semiconductor device constituting a power module can be improved by injecting and curing sealing resins of two types made of different materials depending upon the types of the semiconductor device. However, in order for the resin layer to have a two-layer structure, generally, a longer time will be required to form the two-layer resin layer than to form a single-layer resin layer. Meanwhile, according to the method of manufacturing a semiconductor device in accordance with the second embodiment, as described above, a grid with a two-stage structure is provided in the housing 30 and the sealing resin is fed into each layer of the grid, so that two-layered resin layer can be readily formed by a series of steps of the temperature rising process. A resin layer with three or more layers can also be formed by increasing the number of the grids.

Since the gaps of the upper grid 50 are made larger than the gaps of the grid 32, a small sealing resin can be supported by the grid 32 and a larger sealing resin can be supported by the upper grid 50. The small sealing resin should have such a size that ensures that the sealing resin is allowed to pass through the upper grid 50 and supported by the grid 32 while the large sealing resin should have such a size that the sealing resin is allowed to be supported by the upper grid 50. In the second embodiment, the auxiliary sealing resins 40B are larger than the sealing resins 40A. However, the upper grid 50 may not be provided and the auxiliary sealing resins 40B may be provided on the sealing resins 40A after the sealing resins 40A has been provided. In this case as well, the materials for the sealing resins may be selected such that, in the process of temperature rising, the sealing resins 40A melts first and then the auxiliary sealing resins 40B melts, so that the sealing resin with the two-layer structure can be provided.

Third Embodiment

Figure 7:
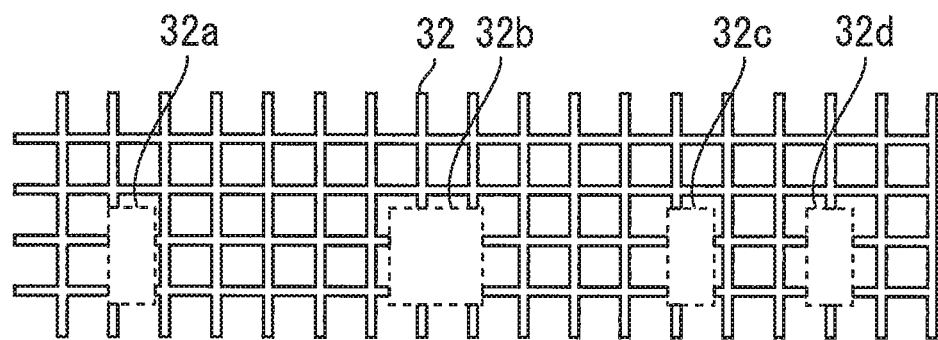
FIG. 7 is a plan view of the grid according to third embodiment.

According to a method of manufacturing a semiconductor device and the semiconductor device in accordance with a third embodiment, the housing and the grid are provided as two separate components. FIG. 7 is a plan view that illustrates an example of the configuration of the grid 32 according to the third embodiment. A plurality of disconnected portions 32a, 32b, 32c, 32d may be provided in the grid 32 for passing a terminal therethrough. The size and the location of the disconnected portions may be specified as appropriate in accordance with the specifications of the product. Such a grid 32 can be incorporated into the housing 30 prior to providing the multiple resins into the housing. For example, the grid 32 may be incorporated into the housing 30 after the insulating substrate 12 has been fixed to the housing 30 so as to feed the resin. Providing the housing and the grid as two separate components makes it possible to provide an optimum grid that conforms to the physical properties of the resins, the internal shape of the power module, or arrangement of the terminals.

Fourth Embodiment

Figure 8:
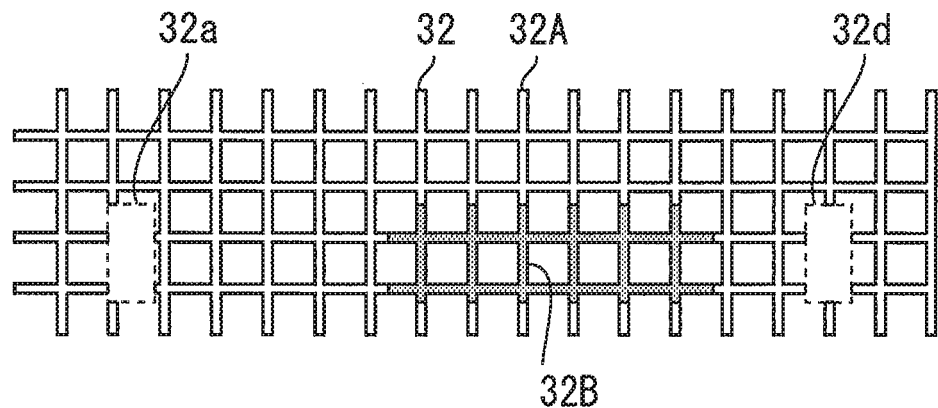
FIG. 8 is a plan view of the grid according to fourth embodiment.

FIG. 8 is a plan view that illustrates an example of the configuration of the grid 32 used in a semiconductor device according to a fourth embodiment. This grid 32 has an insulator portion 32A and a metallic part 32B. The metallic part 32B may be used as a wiring pattern for implementing electrical wiring for the power module.

Figure 9:
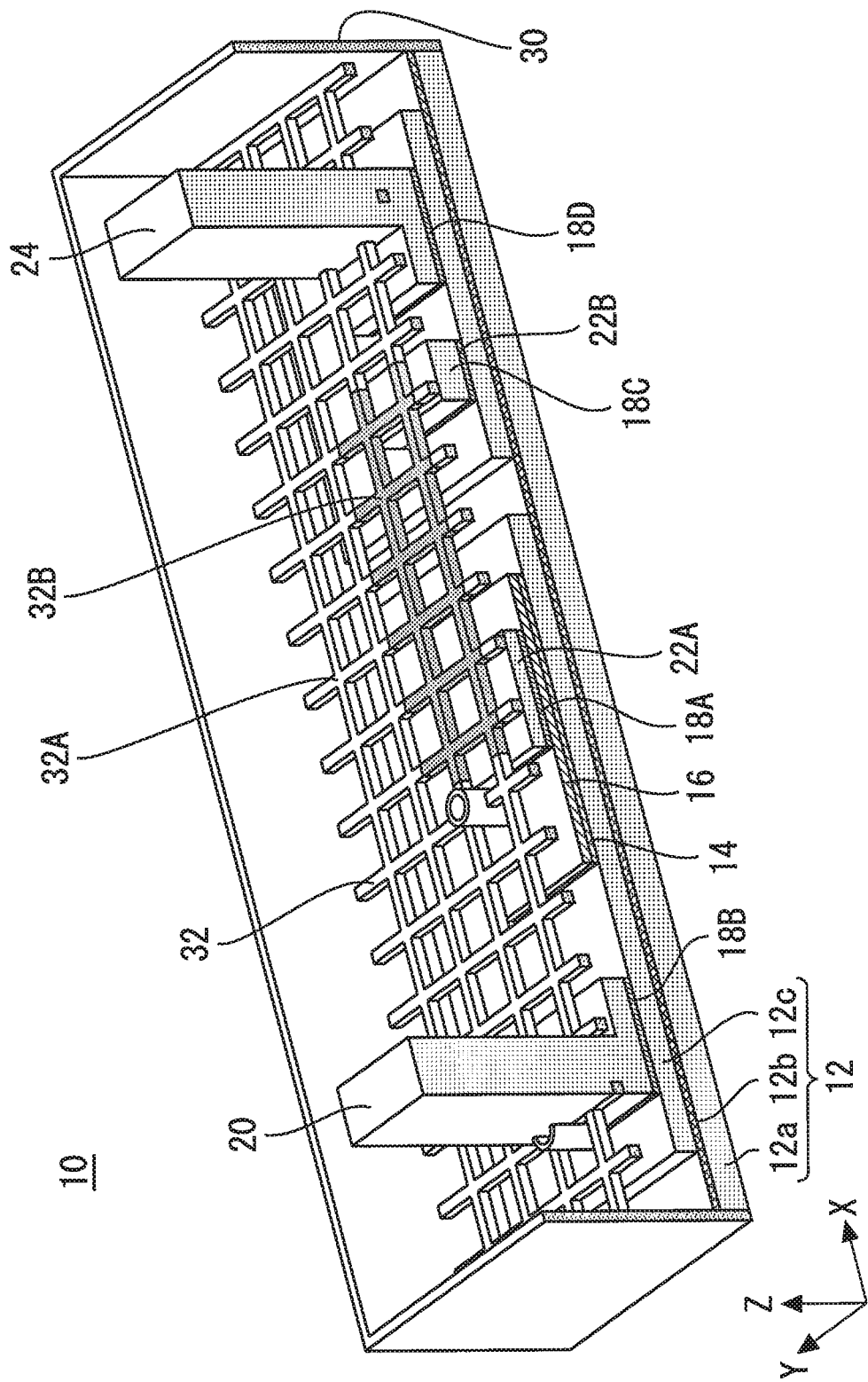
FIG. 9 is a cross-sectional perspective view of a semiconductor device that includes the grid of FIG. 8.

FIG. 9 is a cross-sectional perspective view of an example of the configuration of a semiconductor device that includes the grid 32 illustrated in FIG. 8. The grid 32 is fixed to the inner wall of the housing 30. The metallic part 32B is in contact with the terminals 22A, 22B directly or via a conductive material. The metallic part 32B electrically interconnects the terminal 22A and the terminal 22B. Since the metallic part 32B functions as a wiring pattern, it is possible to conform to different wiring layouts depending on the types without changing the shape of the housing 30.

More detailed explanations will be provided below. When a plurality of power modules having different voltages or different current capacities are to be implemented while they should have the same standardized outer shape of the housing, different wiring configurations will be required depending on the specifications. A metallic wire may be used as a wiring component. If flow of a large current needs to be considered, a metal frame made of copper may be used in place of a metallic wire. If the metal frame should be incorporated into the housing, it will be necessary to provide housings with different shapes depending on the types, and molds for production of housings by the number corresponding to the number of types will be required. For example, change in the location of the semiconductor chip relative to the insulating substrate will necessitate change in the wiring layout and a new housing.

In view of this, according to the fourth embodiment, a grid 32 having a metallic part 32B functioning as a wiring component is incorporated into the inside of the housing 30 after the housing 30 and the insulating substrate 12 have been combined. Since the metallic part 32B is used as a wiring component, the time and labor associated with wiring changes can be reduced and the overall product cost can be reduced. In particular, as an example, if the terminals, which are a metal frame, can be simplified, the degree of freedom in design increases. The metal frame may be made in one piece with the grid or may be a component combined with the grid.

The features of the methods of manufacturing a semiconductor device and the semiconductor devices according to the respective embodiments described in the foregoing may be combined as appropriate. For example, in a configuration where grids are provided in multiple stages, a part of the grids may be provided as a metallic part which may be used as a wiring component.

Fifth Embodiment

This embodiment is a mode of implementation where the semiconductor device according to the above-described first to fourth embodiments is implemented on a power conversion device. Whilst the power conversion device is not limited to a specific power conversion device, an example will be described below as a fifth embodiment in which the semiconductor device according to the above-described first to fourth embodiments is implemented on a three-phase inverter.

Figure 10:
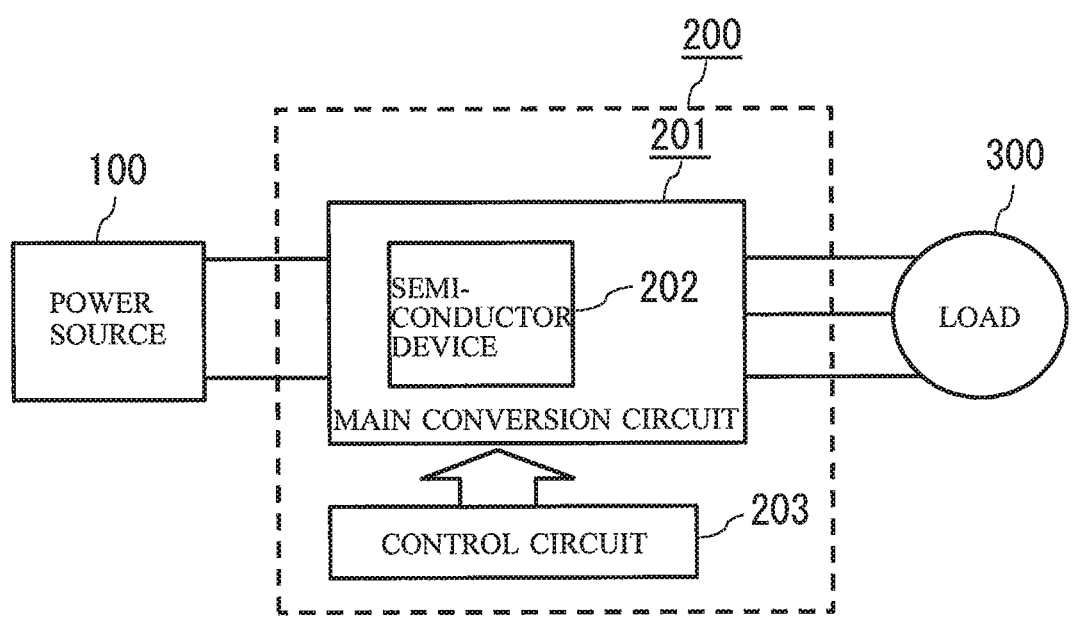
FIG. 10 is a block diagram illustrating a power conversion system.

FIG. 10 is a block diagram that illustrates the configuration of a power conversion system in which the power conversion device according to this embodiment is implemented.

The power conversion system illustrated in FIG. 10 includes a power source 100, a power conversion device 200, and a load 300. The power source 100 is a DC power source and supplies DC power to the power conversion device 200. The power source 100 may be configured by various types of power supply. For example, the power source 100 may be configured by a direct-current system, a solar cell, or a secondary battery, or may be configured by a rectification circuit connected to an alternating-current system or an AC/DC converter. Also, the power source 100 may be configured by a DC/DC converter that converts DC power output from a direct-current system into a predefined electrical power.

The power conversion device 200 is a three-phase inverter connected between the power source 100 and the load 300. The power conversion device 200 converts DC power supplied from the power source 100 into AC power and supplies the AC power to the load 300. The power conversion device 200 includes, as illustrated in FIG. 10, a main conversion circuit 201 that converts DC power into AC power and outputs the AC power, and a control circuit 203 that outputs a control signal for controlling the main conversion circuit 201 to the main conversion circuit 201.

The load 300 is a three-phase electric motor driven by the AC power supplied from the power conversion device 200. It should be noted that the load 300 is not limited to particular applications and may be an electric motor mounted in various electrical devices. For example, the load 300 may be used as an electric motor for hybrid vehicles, electric vehicles, railway cars, elevators, or air-conditioning equipment.

Details of the power conversion device 200 will be described below. The main conversion circuit 201 includes a switching element and a free wheel diode (not shown). Switching of the switching element causes the DC power supplied from the power source 100 to be converted into AC power and thus the main conversion circuit 201 supplies the AC power to the load 300. Whilst various circuit configurations may be contemplated as the specific circuit configuration of the main conversion circuit 201, the main conversion circuit 201 according to this embodiment is a two-level three-phase full bridge circuit which may be configured by six switching elements and six free wheel diodes connected in an anti-parallel manner with the respective switching elements. The semiconductor device that corresponds to any one of those according to the above-described first to fourth embodiments is implemented on at least one of the respective switching elements and the respective free wheel diodes of the main conversion circuit 201. The six switching elements are connected in series to each other for every two switching elements to configure the upper and lower arms, and each of the upper and lower arms constitutes each phase (U-phase, V-phase, and W-phase) of the full bridge circuit. In addition, the output terminals of the respective upper and lower arms, i.e., the three output terminals of the main conversion circuit 201 are connected to the load 300.

Also, the main conversion circuit 201 includes a drive circuit (not shown) that drives the switching elements but the drive circuit may be embedded in the semiconductor device 202 or may be configured to include a drive circuit independently of the semiconductor device 202. The drive circuit generates a drive signal for driving the switching elements of the main conversion circuit 201 and supplies the drive signal to the control electrodes of the switching elements of the main conversion circuit 201. Specifically, the drive circuit outputs, in accordance with a control signal from the control circuit 203 (which will be described later), a drive signal that places the switching element in an enabled state and a drive signal that places the switching element in a disabled state to the control electrodes of the switching elements. When the switching element should be maintained in the enabled state, the drive signal is a voltage signal (enable signal) equal to or higher than a threshold voltage of the switching element. When the switching element should be maintained in the disabled state, the drive signal is a voltage signal (disable signal) equal to or lower than the threshold voltage of the switching element.

The control circuit 203 controls the switching element of the main conversion circuit 201 such that a desired electrical power is supplied to the load 300. Specifically, the control circuit 203 computes the time (enable time) at which the switching elements of the main conversion circuit 201 should be placed in the enabled state based on the electrical power to be supplied to the load 300. For example, the main conversion circuit 201 may be controlled by PWM control which carries out modulation associated with the enable time of the switching elements in accordance with the voltage to be output. In addition, at each point in time, the control command (control signal) is output to the drive circuit included in the main conversion circuit 201 such that an enable signal is output to the switching element that should be placed in the enabled state and a disable signal is output to the switching element that should be placed in the disabled state. The drive circuit outputs, in accordance with the control signal, the enable signal or the disable signal to the control electrodes of the switching elements as the drive signal.

According to the power conversion device in accordance with this embodiment, since the semiconductor device according to the first to fourth embodiments can be implemented as the switching element and the free wheel diode of the main conversion circuit 201, a highly reliable device can be achieved by a simplified process.

Whilst this embodiment has been described based on the example where the above-described semiconductor device is implemented on a two-level three-phase inverter, the above-described semiconductor device is not limited to this example and may be implemented on various power conversion devices. According to this embodiment, the power conversion device is implemented as a two-level power conversion device but it may be implemented as a three-level or multiple-level power conversion device. Also, if electrical power is to be supplied to a single-phase load, the above-described semiconductor device may be implemented on a single-phase inverter. Also, if the electrical power is to be supplied to a DC load, etc., then the above-described semiconductor device may also be implemented on a DC/DC converter or an AC/DC converter.

Also, the power conversion device on which the above-described semiconductor device is implemented is not limited to a case where the above-described load is an electric motor but it may also be used, for example, as a power supply device for an electric discharge machine, a laser machine, an induction heating cooker, or contactless power supply system. Further, the power conversion device may also be used as a power conditioner of a solar power generation system, a power storage system, etc.

Since the grid is provided in the housing and the sealing resin is provided on the grid, it is made possible to continuously carry out the bonding process for bonding components to each other and the melting process for melting the sealing resin, which is advantageous in terms of shortening the time needed to manufacture a semiconductor device.

The invention claimed is:

1. A semiconductor device comprising:
a housing;
an insulating substrate having a metal pattern and fixed to the housing;
a semiconductor chip provided in the housing and fixed to the metal pattern;
a resin layer that covers the semiconductor chip;
a lower grid provided above the semiconductor chip and away from the semiconductor chip in the housing such that the lower grid faces the insulating substrate; and
an upper grid provided above the lower grid inside the housing.

2. The semiconductor device according to claim 1, wherein the lower grid is fixed to the housing by an adhesive.

3. The semiconductor device according to claim 1, wherein the lower grid is brought into fitting engagement with the housing.

4. The semiconductor device according to claim 1, wherein the lower grid has a metallic part.

5. The semiconductor device according to claim 4, further comprising a terminal in contact with the metallic part directly or via a conductive material.

6. A power conversion device comprising:
a main conversion circuit having a semiconductor device, the main conversion circuit is configured to convert an input electrical power and outputs the converted electrical power; and
a control circuit configured to outputs a control signal controlling the main conversion circuit to the main conversion circuit, wherein
the semiconductor device includes a housing, an insulating substrate having a metal pattern and fixed to the housing, a semiconductor chip provided in the housing and fixed to the metal pattern, a resin layer that covers the semiconductor chip, a lower grid provided above the semiconductor chip and away from the semiconductor chip in the housing such that the grid faces the insulating substrate, and an upper grid provided above the lower grid inside the housing.

* * * * *